United States Patent [19]
Berasi et al.

[11] Patent Number: 5,744,214
[45] Date of Patent: Apr. 28, 1998

[54] CORROSION RESISTANT MOLYBDENUM MASK

[75] Inventors: Peter Henry Berasi, Hopewell Junction; Hsing Hsiung Chen, Poughkeepsie, both of N.Y.

[73] Assignee: International Business Machines Corporation, Armonk, N.Y.

[21] Appl. No.: 792,815

[22] Filed: Jan. 30, 1997

[51] Int. Cl.$^6$ .............................. B32B 15/04; B32B 3/10
[52] U.S. Cl. ................................... 428/137; 428/472
[58] Field of Search ................................... 428/457, 469, 428/472, 596, 131, 137

[56] References Cited

U.S. PATENT DOCUMENTS

| | | | |
|---|---|---|---|
| 4,603,056 | 7/1986 | MacKinnon et al. | 427/38 |
| 4,803,110 | 2/1989 | Ahn et al. | 428/137 |
| 5,076,147 | 12/1991 | Hegner et al. | 92/103 SD |
| 5,268,068 | 12/1993 | Cowell et al. | 156/644 |

OTHER PUBLICATIONS

"A High Resolution RIE Composite Mask," *Research Disclosure*, Mar. 1992, No. 335.

*Primary Examiner*—John J. Zimmerman
*Attorney, Agent, or Firm*—Michael J. Balconi-Lamica, Esq.; Jenkens & Gilchrist, P.C.; Ira D. Blecker, Esq.

[57] ABSTRACT

A molybdenum mask for use in the sputter deposition of electrically conductive materials on preselected areas of a substrate is coated with a transition metal carbide. The carbide protects the metal images defined on the mask from degradation during mask cleaning and related processes, thereby dramatically extending the usable service life of the mask. The present invention overcomes the problem of reduced usable life of a molybdenum mask used in sputter coating and similar evaporative deposition processing.

4 Claims, 1 Drawing Sheet

CORROSION RESISTANT MOLYBDENUM MASK

BACKGROUND OF THE INVENTION

This invention relates generally to a thin sheet of metal containing an open pattern that is used to shield selected portions of a surface during a deposition process, and more particularly to a mask for sputter deposition of electrically conductive materials on preselected areas of a substrate.

Masks, having an open pattern defining a desired circuit or other conductive surface features, are commonly used in the manufacture of semiconductor devices. Typically, the masks are used for screening a metallized paste onto a substrate in the formation of multi-layer ceramic (MLC) structures, and in the formation of electrical features by evaporative processes such as sputter deposition.

The present invention is directed toward a mask specifically adapted for sputter deposition of electrically conductive materials on preselected areas of a substrate, in particular the evaporative formation of controlled collapse chip connection (C4) terminal pads on a wafer. After each use, in which multiple layers, for example chromium, copper, gold, lead and tin, are typically deposited in successive layers on the substrate, the mask must be cleaned before reuse. The deposition process results in a significant quantity of metal deposit onto the molybdenum mask. If not cleaned, vias and other small openings are reduced in size and features. Currently, sputter deposition masks, generally formed of molybdenum, are cleaned in a strong acid such as hot hydrochloric acid to strip the process-deposited chromium, copper, gold, lead and tin plating from the mask. It is difficult to stop the cleaning process at a point where the undesired process-deposited plating is removed but the underlying molybdenum mask is not etched or corroded. Typically, the molybdenum mask used in evaporative or sputter deposition processes lasts only a relatively few cycles, for example on the order of seven or eight cycles, before the vias and other small openings become enlarged as a result of corrosion that occurs during the cleaning process.

Coatings have been proposed for molybdenum masks used in the screen application of electrically-conductive paste materials on a ceramic base. During such processes, the electrically-conductive paste contains abrasive which causes wear of the mask and subsequent enlargement of the openings as a result of abrasive wear. Various wear-resistant coatings, for example metal nitride coatings, have been proposed in U.S. Pat. No. 4,603,056 issued Jul. 29, 1986 to Donald A. MacKinnon, et al and in U.S. Pat. No. 4,803,110 issued Feb. 7, 1989 to Kie Y. Ahn, et al. However, it has been found that nitride coatings are not effective for preventing corrosion of the underlying molybdenum during cleaning of the mask after evaporative deposition.

The present invention is directed to overcoming the problems set forth above. It is desirable to have a mask for sputter deposition of electrically conductive materials on preselected areas of a substrate wherein the electrically conductive material can be readily removed from the mask after deposition, without significant damage to the mask. It is also desirable to have such a mask that can be repeatably cleaned after each of a multiple number of uses without significant damage to the mask, thereby greatly extending the useful life of the mask.

BRIEF SUMMARY OF THE INVENTION

In accordance with one aspect of the present invention, a mask for the sputter deposition of electrically conductive materials on preselected areas of a substrate includes a molybdenum mask having openings arranged to form a pattern representative of the preselected areas of the substrate, and a carbide coating disposed on the external surfaces of the mask. The carbide coating is formed of a transition metal carbide.

Other features of the mask for sputter deposition of electrically conductive materials on preselected areas of a substrate, in accordance with the present invention, includes the transition metal carbide coating being selected from the group, consisting of chromium carbide, titanium carbide, vanadium carbide, zirconium carbide, niobium carbide, molybdenum carbide, hafnium carbide, tantalum carbide, and tungsten carbide. Other features of the mask include the transition metal carbide coating being formed by chemical vapor deposition to a thickness of from about 0.01 µm to about 10 µm on the planar surfaces of the mask.

BRIEF DESCRIPTION OF THE DRAWINGS

A more complete understanding of the structure of the present invention may be had by reference to the following detailed description when taken in conjunction with the accompanying drawings, wherein.

DETAILED DESCRIPTION OF THE INVENTION

Figure 1:
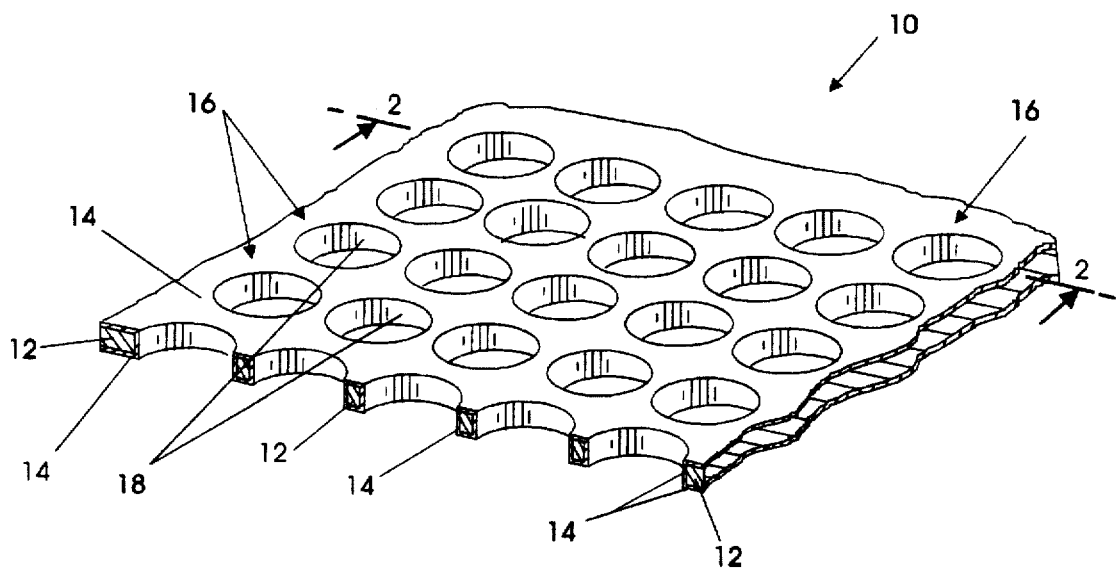
FIG. 1 is a fragmentary view of a portion of a carbide coated mask embodying the present invention.

As illustrated in FIG. 1, a mask 10 embodying the present invention includes a conventional molybdenum mask 12 of the type used to provide a shield for preselected areas on a substrate during the sputter deposition of electrically conductive materials onto the substrate. The molybdenum mask 12 is coated with a thin film 14 of a transition metal carbide, such as chromium carbide, titanium carbide, vanadium carbide, zirconium carbide, niobium carbide, molybdenum carbide, hafnium carbide, tantalum carbide, and tungsten carbide. It has been discovered that a chromium carbide coating 14, in particular, will advantageously protect the metal images defined by the mask 10 from degradation during the mask cleaning and related processes.

Figure 2:
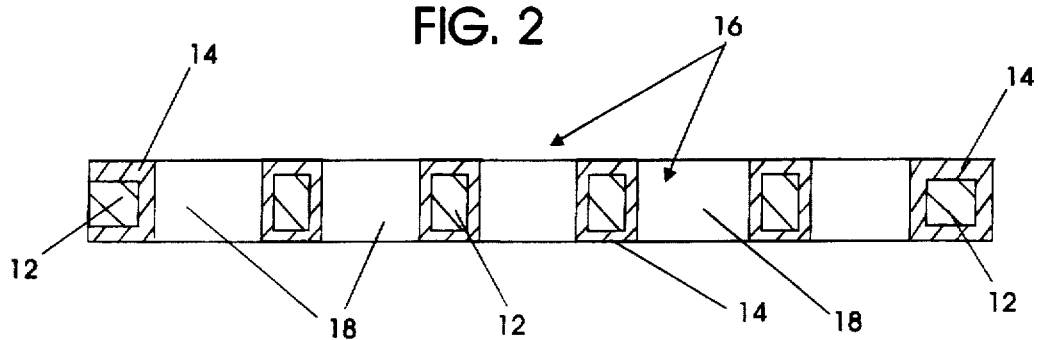
FIG. 2 is a sectional view, taken along the line 2—2 in FIG. 1, of the carbide coated mask embodying the present invention.

The conventional uncoated molybdenum mask 12 thus provides a substrate for the coated mask 10 embodying the present invention. The molybdenum substrate 12 has openings 16 defined by transverse walls 18 extending between the upper and lower planar surfaces of the mask 12 which are arranged to form a pattern representative of desired preselected areas to be coated on a substrate. In the present invention, a transition metal carbide coating 14, as identified above, is formed on the external surfaces of the molybdenum substrate 12. The coating 14 may be applied by any one of several conventional processes, but preferably is formed by conventional vapor deposition processes such as chemical vapor deposition (CVD), plasma vapor deposition (PVD), or plasma enhanced chemical vapor deposition (PECVD). Desirably, the deposited coating 14 has a thickness of from about 0.01 µm to about 10 µm on the two planar surfaces of mask and about one-half that thickness on the pattern-defining walls 18 extending between the planar surfaces. The thickness of the transition metal coating 14 relative to the underlying molybdenum mask 12 is somewhat exaggerated in FIG. 2 for illustration purposes.

As identified above, the carbide coating 14 is formed of a transition metal carbide, desirably selected from the group consisting of chromium carbide, titanium carbide, vanadium carbide, zirconium carbide, niobium carbide, molybdenum carbide, hafnium carbide, tantalum carbide, and tungsten carbide. Chromium carbide is the preferred carbide coating 14.

As described briefly above, masks used for the evaporative or sputter deposition of conductive metals on a substrate, such as chromium, copper, gold, lead and tin, must be cleaned after each deposition cycle to remove the extraneous metals deposited on the mask during the process. The stripping process requires the use of harsh, corrosive chemicals which attack the surface of the mask and shorten its life. Heretofore it has been necessary to discard a mask after only a few deposition cycles, for example after seven or eight cycles, due to the enlargement of the pattern-defining openings as a result of chemical corrosion during the cleaning process.

In preparation for an actual test, two molybdenum masks 12 were coated. The first mask was coated with titanium nitride, as taught by the above-described prior art. The second mask was coated with chromium carbide. The coatings on both masks were substantially equal, varying from about 0.01 to about 10 μm thick on the planar surface of the mask to a thickness of from about 0.005 to 5 μm thick on the walls extending between the planar surfaces of the mask. The coatings were formed by chemical vapor deposition.

Both of the coatings were tested in a beaker cleaning process representative of a typical process for cleaning C4 evaporation mask after deposition of electrically conductive coatings on a wafer. The titanium nitride and chromium carbide coated molybdenum masks were tested under identical conditions, i.e., at the same bath temperatures and soak times. The masks were first given an alkali treatment by soaking in a solution of sodium hydroxide. After the alkali treatment, the masks were placed in a beaker containing a mixture of acetic acid and fluoroboric acid, then rinsed in deionized water and placed in a second beaker containing heated hydrochloric acid. The masks were then given a final rinse in deionized water and dried.

The chromium carbide coated mask 10, embodying the present invention, survived 25 of the above-described cleaning cycles, whereas the titanium nitride coated molybdenum mask survived exposure to one cleaning cycle, but failed during the second cleaning cycle. The failure mechanism for the titanium nitride coating was delamination of the coating from the mask surface. This mechanism was not detected on the chromium carbide coated mask 10. Furthermore, the chromium carbide coated mask 10 survived 25 cleaning cycles without any significant deterioration of the coating 14, indicating at least a three-fold increase over the service life of an uncoated molybdenum mask. Thus, it has been demonstrated that when the external surfaces of the mask 12 are coated with chromium carbide 14, that the useful service life of the mask 10 is dramatically extended. It is believed that a similar beneficial increase in corrosion resistance will also be provided by other transition metal carbide, and in particular by the above specifically identified transition metal carbides.

Thus, it has been found that providing a transition metal carbide coating 14 on a conventional molybdenum mask 12, that the useful life of the mask 10 is dramatically extended. The transition metal carbide coating 14 eliminates the wear-out mechanism by making the molybdenum mask 12 impervious to the action of the cleaning process.

Although the present invention is described in terms of a preferred exemplary embodiment, the specific illustrative transition metal carbides and deposition process, those skilled in the art will recognize that changes in the specific transition metal carbide and the preferred deposition process, may be made without departing from the spirit of the invention. Such changes are intended to fall within the scope of the following claims. Other aspects, features, and advantages of the present invention can be obtained from a study of this disclosure, along with the appended claims.

What is claimed is:

1. A mask for sputter deposition of electrically conductive materials on areas of a substrate, comprising:

a molybdenum mask having openings arranged to form a pattern representative of the areas of said substrate; and a carbide coating disposed on the external surfaces of said mask, said carbide coating being formed of a material selected from the group consisting of chromium carbide, titanium carbide, vanadium carbide, zirconium carbide, niobium carbide, molybdenum carbide, hafnium carbide, tantalum carbide, and tungsten carbide.

2. A mask, as set forth in claim 1, wherein said carbide coating is chromium carbide.

3. A mask, as set forth in claim 1, wherein said carbide coating has a thickness of from about 0.01 μm to about 10 μm on planar surfaces of the mask.

4. A mask, as set forth in claim 1, wherein said carbide coating is formed by chemical vapor deposition.

* * * * *